US007012444B2

(12) United States Patent
Kojima

(10) Patent No.: US 7,012,444 B2
(45) Date of Patent: Mar. 14, 2006

(54) SEMICONDUCTOR TESTER

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/848,823

(22) Filed: May 19, 2004

(65) Prior Publication Data

US 2005/0225349 A1   Oct. 13, 2005

Related U.S. Application Data

(63) Continuation of application No. PCT/JP02/12123, filed on Nov. 20, 2002.

(30) Foreign Application Priority Data

Nov. 20, 2001   (JP) ............................. 2001-354217

(51) Int. Cl.
*G01R 1/04* (2006.01)
(52) U.S. Cl. .................... 324/765; 324/158.1
(58) Field of Classification Search ................. 327/52, 327/64–65, 112; 209/552, 573, 574; 324/158.1, 324/754–765, 103 P
See application file for complete search history.

(56) References Cited

U.S. PATENT DOCUMENTS 5,842,155 A * 11/1998 Bryson et al. ............... 702/124

6,642,707 B1 * 11/2003 Iorga et al. ............... 324/158.1

FOREIGN PATENT DOCUMENTS

| JP | 4-189051 | 7/1992 |
| JP | 8-242151 | 9/1996 |

OTHER PUBLICATIONS

Patent Abstracts of Japan, Publication No. 08-242151 dated Sep. 17, 1996, 1 pg.
Patent Abstracts of Japan, Publication No. 04-189051 dated Jul. 7, 1992, 1 pg.
International Search Report issued in International application No. PCT/JP02/12123, mailed on Mar. 4, 2003, 2 pgs.

* cited by examiner

*Primary Examiner*—Zandra V. Smith
*Assistant Examiner*—Roberto Velez
(74) *Attorney, Agent, or Firm*—Osha-Liang LLP

(57) ABSTRACT

A semiconductor tester comprising a driver circuit for generating a predetermined driver waveform without using a coil device. The driver circuit provided in a pin electronics receives a waveform-shaped signal to be supplied to an IC pin of a device under test (DUT) and converts the amplitude to an amplitude of predetermined level. The driver output pulse outputted from the output terminal of the driver and having the converted amplitude to the IC pin of the DUT. The tester has pulse compensating means for compensating the individual waveforms of the rising and falling edges of the driver output pulse in a predetermined way.

15 Claims, 9 Drawing Sheets

US 7,012,444 B2

SEMICONDUCTOR TESTER

The present application is a continuation application of PCT/JP02/12123 filed on Nov. 20, 2002 which claims the benefit of and priority from a Japanese patent application No. 2001-354217 filed on Nov. 20, 2001, the entire contents of which are incorporated herein by reference for all purposes.

TECHNICAL FIELD

The present invention relates to a semiconductor tester provided with a driver circuit for applying a predetermined test waveform to a device under test (DUT). Particularly, the present invention relates to a semiconductor tester provided with a driver circuit capable of improving a waveform to be applied to an IC pin of a DUT.

BACKGROUND ART

FIG. 9 shows the representative schematic configuration of a semiconductor test apparatus. The main configuration elements include a timing generator TG, a pattern generator PG, a waveform formatter FC, a pin electronics PE, a performance board PB, a transmission line CB1, a logic comparator DC, and a fail memory FM. The pin electronics PE is provided with a driver DR or a comparator CP, etc. Here, since the semiconductor tester is publicly known and it is technically well known, the signals or configuration elements except the main elements related to this invention will not be described in detail.

FIG. 2 shows waveforms that indicate a driver terminal output pulse Vout to be outputted from an output terminal of the driver DR and a DUT terminal-applied pulse Vdut of an IC pin terminal of a DUT receiving the driver terminal output pulse Vout. Here, the DUT terminal-applied pulse Vdut is the pulse to be purposefully applied.

The high level component of the waveform to be supplied to the DUT decreases depending upon the transmission line CB1 coupled to the output terminal of the driver DR or the load of other elements. Accordingly, a circuit like a peaking circuit 4 shown in FIG. 1 for raising the high level component is mounted in the driver circuit. As the result of the peaking circuit, the waveform of the driver terminal output pulse Vout as shown by A and B of FIG. 2 is outputted. If this waveform reaches the IC pin of the DUT after transmitted through the performance board PB and the transmission line CB1, a proper waveform like the DUT terminal-applied pulse Vdut shown in FIG. 2, which is purposeful, can be applied.

FIG. 1 shows the principle configuration of a conventional driver circuit of an AE station type related to this invention.

The configuration elements of the driver circuit include a preceding stage and a last stage. The preceding stage is provided with transistors Q3 and Q4 which are differential switches, resisters R1 and R2, and a constant current source 2. Further, as a power source VL of the load coupled to the constant current source 2 a power source by which the circuit can operate is used. The last stage is provided with transistors Q1 and Q2 which are to be driven so that a predetermined waveform can be obtained in the DUT terminal, are sister R3, and a peaking circuit 4. The peaking circuit 4 is provided with a resistor 4 and a coil 4.

Here, the driver circuit of the AE station type is to regulate the amplitude of high and low levels to be a predetermined level by driving the last stage to perform current switching. Accordingly, its output terminal is configured with the NPN transistor and the resistor R3 of predetermined resistance. Further, the resistance of the resistor R3 is used about 50Ω in response to the impedance of the transmission line.

The preceding stage which is a differential amplifier receives a format signal DRP from the waveform formatter FC as a driver input pulse P1, converts it into a differential signal of predetermined amplitude by a predetermined voltage level, and supplies it to the base input terminal of the transistors Q3 and Q4, while supplying differential switch signals Q3s and Q4s inverted to have predetermined amplitude to the based input terminals of the corresponding last stage from the collectors of both the transistors.

The last stage which is a differential amplifier receives the differential switch signals Q3s and Q4s and outputs the driver terminal output pulse Vout buffered to predetermined drive capability by predetermined amplitude from the collector of the one-side transistor Q2. At this time, a high-side output voltage Vhi is determined by a power source voltage VH1, whereas a low-side output voltage Vlow is determined by {VH1−i1×R3}. Further, the waveforms of the rising and falling edges are outputted by the peaking circuit 4 in the form of the waveforms on which peaking compensation has been performed as shown by A and B in FIG. 2.

According to the conventional configuration as described above, it is necessary to use a coil device in order to realize the drive waveform on which peaking compensation has been performed. It is difficult to integrate the coil device into an LSI. Further, the peaking compensation processes for both rising and falling sides cannot be individually performed in the circuit configuration shown in FIG. 1. Accordingly, if the asymmetry of the waveform at the DUT terminal occurs, it is impossible to perform a symmetrical correction so as to obtain the desirable quality of the waveform. In addition, if the waveform to be applied to the DUT can be applied in a desirable state, the measurement quality of the device test by the semiconductor tester can be further improved.

DISCLOSURE OF THE INVENTION

Accordingly, it is an object of the present invention to provide a semiconductor tester provided with a driver circuit capable of generating a predetermined driver waveform without using a coil device.

And it is an object of the present invention to provide a semiconductor tester provided with a driver circuit capable of generating a driver waveform whose peaking compensation amount can be adjusted in a desirable manner.

And it is an object of the present invention to provide a semiconductor tester provided with a driver circuit capable of individually performing the peaking compensation processes for both rising and falling sides.

The first means for achieving the above objects will be shown. Here, FIGS. 3, 4 and 5 show the means for achieving the above objects according to this invention.

In order to solve the above problems, a semiconductor tester includes a driver circuit for supplying a signal of a predetermined waveform to be applied to an IC pin of a device under test (DUT) via a predetermined transmission line CB1, wherein the driver circuit includes means (e.g. drive pulse generating means 100) for receiving a driver input pulse P1 of a logic signal, detecting a rising edge of the driver input pulse and generating a differential rise correction pulse P2 to perform a peaking correction on a rise of a wave form, means (e.g. drive pulse generating means 100) for receiving a driver input pulse P1 of a logic signal, detecting a falling edge of the driver input pulse and generating a differential fall correction pulse P3 to perform a peaking correction on a fall of a waveform, and means (e.g. a rise pulse superimposing section 210, a fall pulse superimposing section 220, and preceding and last stages of the drive circuit) for performing the peaking correction on a rising part of a waveform outputted from the driver circuit based on the differential rise correction pulse P2, whereas performing a peaking correction on a falling part of a waveform outputted from the driver circuit based on the differential fall correction pulse P3, and thereby compensates the attenuation of the high band component due to the transmission line CB1 and applies a signal whose waveform quality is excellent to the IC input terminal of the DUT.

Next, the second means for achieving the above objects will be shown. Here, FIGS. 3 and 5 show the means for achieving the above objects according to this invention.

In order to solve the above problems, a semiconductor tester includes a driver circuit for supplying a signal of a predetermined waveform to be applied to an IC pin of a device under test (DUT) via a predetermined transmission line CB1, wherein the driver circuit includes drive pulse generating means for receiving a rising edge of a driver input pulse P1 (a format signal DRP) of a logic signal and generating a differential rise correction pulse P2 of a predetermined period, whereas receiving a falling edge of a driver input pulse of a logic signal and generating a differential fall correction pulse P3 of a predetermined period, a rise pulse superimposing section 210 for receiving the differential rise correction pulse P2 and generating a first sink current iQ5 whose current amount corresponds to the differential rise correction pulse P2, a fall pulse superimposing section 220 for receiving the fall correction pulse P3 and generating a second sink current iQ7 whose current amount corresponds to the fall correction pulse P3, and preceding and last stages of the driver circuit for outputting a test waveform to be supplied to the DUT by receiving the first sink current iQ5 and performing a peaking correction on a rising side of the test waveform, while receiving the second sink current iQ7 and performing a peaking correction on a falling side of the test waveform, and thereby compensates the attenuation of the high band component due to the transmission line CB1 and applies a signal whose waveform quality is excellent to the IC input terminal of the DUT.

Next, the third means for achieving the above objects will be shown. Here, FIGS. 7 and 8 show the means for achieving the above objects according to this invention.

In order to solve the above problems, a semiconductor tester includes a driver circuit for supplying a signal of a predetermined waveform to be applied to an IC pin of a device undertest (DUT) via a predetermined transmission line, wherein the driver circuit includes a plurality (n: an integer more than or equal to 2) of drive pulse generating means, each of which receives a rising edge of a driver input pulse P1 (a form at signal DRP) of a logic signal and generates a differential rise correction pulse P2 so that the rise correction pulse P2 has a different pulse period, whereas receiving a falling edge of a driver input pulse P1 of a logic signal and generating a differential fall correction pulse P3 so that the fall correction pulse P3 has a different pulse period, a plurality (n) of rise pulse superimposing sections 210, each of which receives a plurality (n) of the differential rise correction pulses P2 and generates a first sink current iQ5 of a predetermined sink current amount for a predetermined pulse period, a plurality (n) of fall pulse superimposing sections 220, each of which receives a plurality (n) of the fall correction pulses P3 and generates a second sink current iQ7 of a predetermined sink current amount for a predetermined pulse period, and preceding and last stages of the driver circuit for outputting a test waveform to be supplied to the DUT by receiving a plurality (n) of the first sink currents iQ5 and performing a peaking correction on a rising side of the test waveform, while receiving a plurality (n) of the second sink currents iQ7 and performing a peaking correction on a falling side of the test waveform, and thereby compensates the attenuation of the high band component due to the transmission line CB1 and applies a signal whose waveform quality is excellent to the IC input terminal of the DUT.

Next, the fourth means for achieving the above objects will be shown. Here, FIG. 4 shows the means for achieving the above objects according to this invention.

In an aspect of the drive pulse generating means 230, it receives a drive input pulse P1 (a format signal DRP) of a logic signal, firstly detects a rising edge of the driver input pulse (e.g. a rising edge detector 21) and generates a differential rise correction pulse of a predetermined period (e.g. the configuration of a minute delay means DL1 and an SR flip-flop 23), secondly detects a falling edge of the driver input pulse (e.g. a falling edge detector 22) and generates a differential fall correction pulse of a predetermined period (e.g. the configuration of a minute delay means DL2 and an SR flip-flop 24), and thirdly generates a differential driver pulse (the driver input pulse P1) corresponding to the driver input pulse (e.g. a differential gate 25).

Next, the fifth means for achieving the above objects will be shown. Here, FIG. 3 shows the means for achieving the above objects according to this invention.

In an aspect of the rise pulse superimposing section 210, it includes a first constant current source (e.g. a variable constant current source CS3) and first and second transistors Q5 and Q6 of a first differential amplification configuration, the first constant current source is coupled to emitters of the both transistors and makes a constant current amount flowing through any of the both transistors be constant, and the first and second transistors Q5 and Q6 receive the differential rise correction pulse P2 in base terminals thereof and generate a first sink current iQ5 of a constant current amount on which current switching has been performed.

Next, the sixth means for achieving the above objects will be shown. Here, FIG. 3 shows the means for achieving the above objects according to this invention.

In an aspect of the fall pulse superimposing section 220, it includes a second constant current source (e.g. a variable constant current source CS4) and third and fourth transistors Q7 and Q8 of a second differential amplification configuration, the second constant current source is coupled to emitters of the both transistors and makes a constant current amount flowing through any of the both transistors Q7 and Q8 be constant, and the third and fourth transistors Q7 and Q8 receive the differential fall correction pulse P3 in base terminals thereof and generate a second sink current iQ7 of a constant current amount on which current switching has been performed.

Next, the seventh means for achieving the above objects will be shown. Here, FIG. 3 shows the means for achieving the above objects according to this invention.

In an aspect of the preceding stage of the driver circuit for supplying a differential drive voltage signal to determine a voltage level, which is a high or low level, to be outputted from the last stage, it includes first and second resistors R1 and R2, a third constant current source 2, and fifth and sixth transistors Q3 and Q4 of a third differential amplification configuration, the first resistor R1, which is a load resistor coupled to a collector of the fifth transistor Q3, is coupled to a collector terminal of the first transistor Q5 for generating the first sink current iQ5 of the rise pulse superimposing section 210, the second resistor R2, which is a load resistor coupled to a collector of the sixth transistor Q4, is coupled to a collector terminal of the third transistor Q7 for generating the second sink current iQ7 of the fall pulse superimposing section 220, the third constant current source 2 is coupled to both emitters of the third differential transistors and allows a predetermined constant current amount to flow, and current switching is performed based on a differential drive input pulse P1 received by the both transistors of the third differential amplification configuration, while the differential drive voltage signal weighted by the first and second sink currents iQ5 and iQ7 is outputted from collectors of the both transistors and supplied to the last stage.

Next, the eighth means for achieving the above objects will be shown. Here, FIG. 3 shows the means for achieving the above objects according to this invention.

In an aspect of the last stage of the driver circuit, it includes seventh and eighth transistors Q1 and Q2 of a fourth differential amplification configuration, first and second current dividing resistors R11 and R12, a first load resistor R3, and a fourth constant current source 1, the seventh and eighth transistors Q1 and Q2 receive the differential drive voltage signal outputted from the preceding stage of the driver circuit in a base input terminal thereof, amplify the differential drive voltage signal in a predetermined manner, and generate an applied signal of a predetermined waveform to be supplied to the DUT from a collector terminal of the eighth transistor Q2, the first and second current dividing resistors R11 and R12, which are emitter resistors individually coupled to emitters of the both transistors, while other ends of the current dividing resistors are coupled to the fourth constant current source 1, the first load resistor R3, which becomes a load resistor coupled to the constant current source VH1 and the collector terminal of the eighth transistor Q2, supplies the applied signal of a predetermined waveform to the DUT, and the fourth constant current source 1 becomes a constant current source inserted between a negative power source VL and the first and second current dividing resistors R11 and R12.

Next, the ninth means for achieving the above objects will be shown. Here, FIG. 3 shows the means for achieving the above objects according to this invention.

In an aspect of the first or second constant current source, it is a fixed constant current source for supplying an invariable constant current amount to perform desired peaking compensation or a variable constant current source CS3 or CS4 whose constant current amount is externally changeable so that desired peaking compensation can be performed.

The summary of the invention does not necessarily describe all necessary features of the present invention. The present invention may also be a sub-combination of the features described above.

BEST MODE FOR CARRYING OUT THE INVENTION

The invention will now be described based on the preferred embodiments, which do not intend to limit the scope of the present invention, but exemplify the invention. All of the features and the combinations thereof described in the embodiment are not necessarily essential to the invention.

The present invention will be hereafter described referring to FIGS. 3, 4, 5 and 6. Further, the elements in response to the conventional configuration are given the same symbols, and the matters repeated will not be described.

Figure 3:
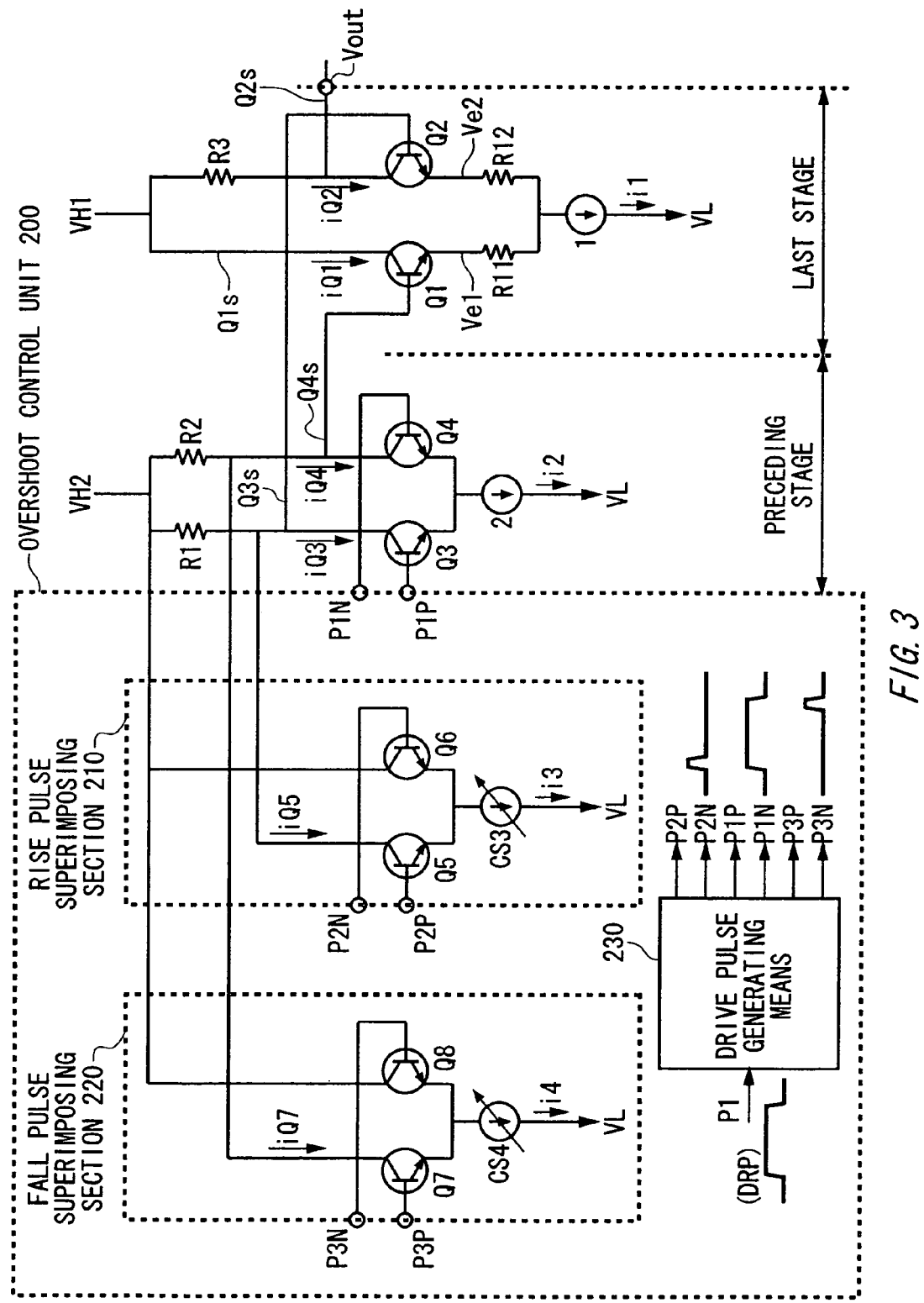
FIG. 3 shows the principle configuration of a driver circuit of an AE station type according to this invention.

FIG. 3 shows the principle configuration of a driver circuit of an AE station type according to this invention.

The configuration elements of the driver circuit include an overshoot control unit 200, a preceding stage and a last stage. The preceding stage is the same as the conventional one. The last stage is configured to eliminate the peaking circuit 4 among the conventional elements and add current dividing resistors R11 and R12 with the voltage of the power source voltage VH1 and the current amount i1 of the constant current source 1 being used under a predetermined condition.

Figure 1:
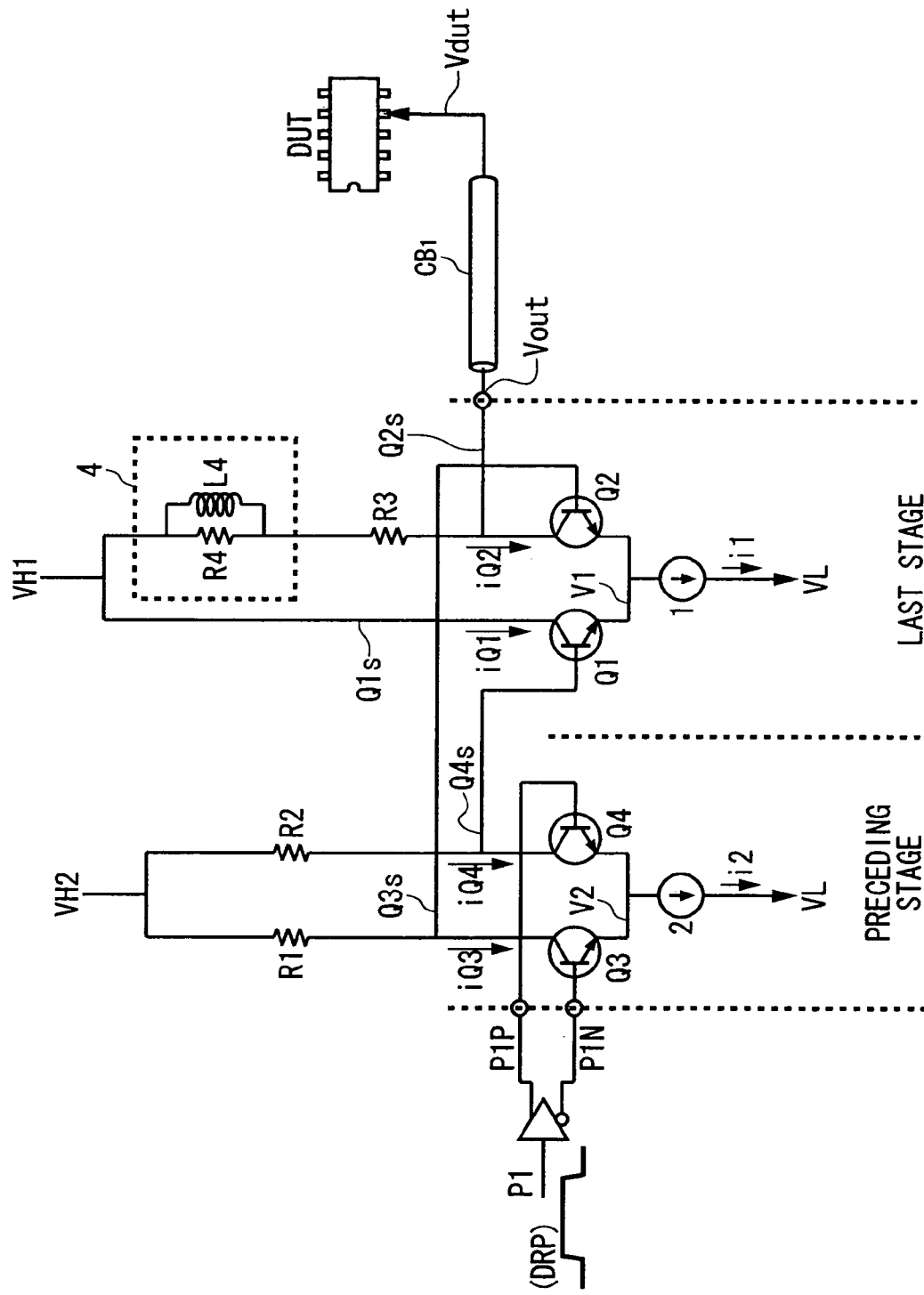
FIG. 1 shows the principle configuration of a conventional driver circuit of an AE station type related to this invention.
Figure 2:
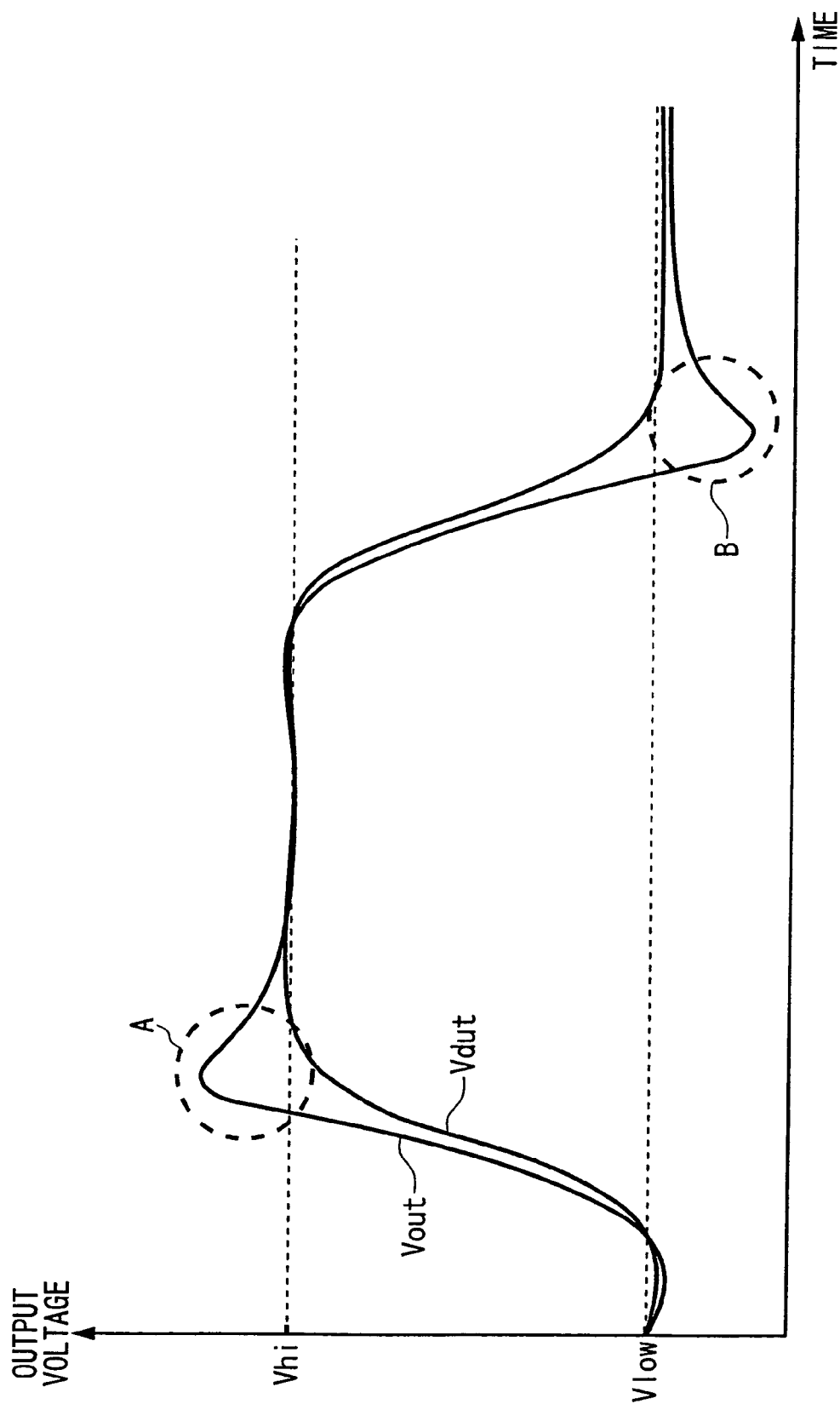
FIG. 2 shows waveforms that indicate a driver terminal output pulse to be outputted from an output terminal of a driver DR and a DUT terminal-applied pulse of an IC pin terminal of a DUT receiving the driver terminal output pulse.

The current dividing resistors R11 and R12, which are used in order that the collector currents iQ1 and iQ2 of the transistors Q1 and Q2 are proportion to the base voltages inputted to the base terminals, have their resistance that are small about 5Ω. And the voltage of the power source voltage VH1 and the current amount i1 of the constant current source 1 are under such a condition that both the transistors can always operate in the active state. Consequently, both the transistors can always operate in the active state. For example, if it is assumed that the current amount i1 is 100 mA in the conventional way shown in FIG. 1, it is 200 mA or more in this invention under the condition to generate even more than twice the amplitude.

Further, in case of designing the preceding stage under such a condition that the emitter resistors provided to the transistors Q1 and Q2 them selves can be applied, these resistors can be eliminated.

Here, the collector current iQ2 of the transistor Q2 by the current dividing resistors R11 and R12 will be described referring to FIG. 6 that shows the collector current characteristics in response to the voltage difference between the last stage and the base. Here, it is assumed that the voltage difference (Q3s−Q4s) between both the differential switch signals Q3s and Q4s supplied from the preceding stage is ±0.5V in a normally state and ±1V in peaking operation. In addition, the current amount i1 of the constant current source 1 is under the current condition larger than the maximum collector current iQ2 so that the transistors Q1 and Q2 can always be in the region of the active state.

Figure 6:
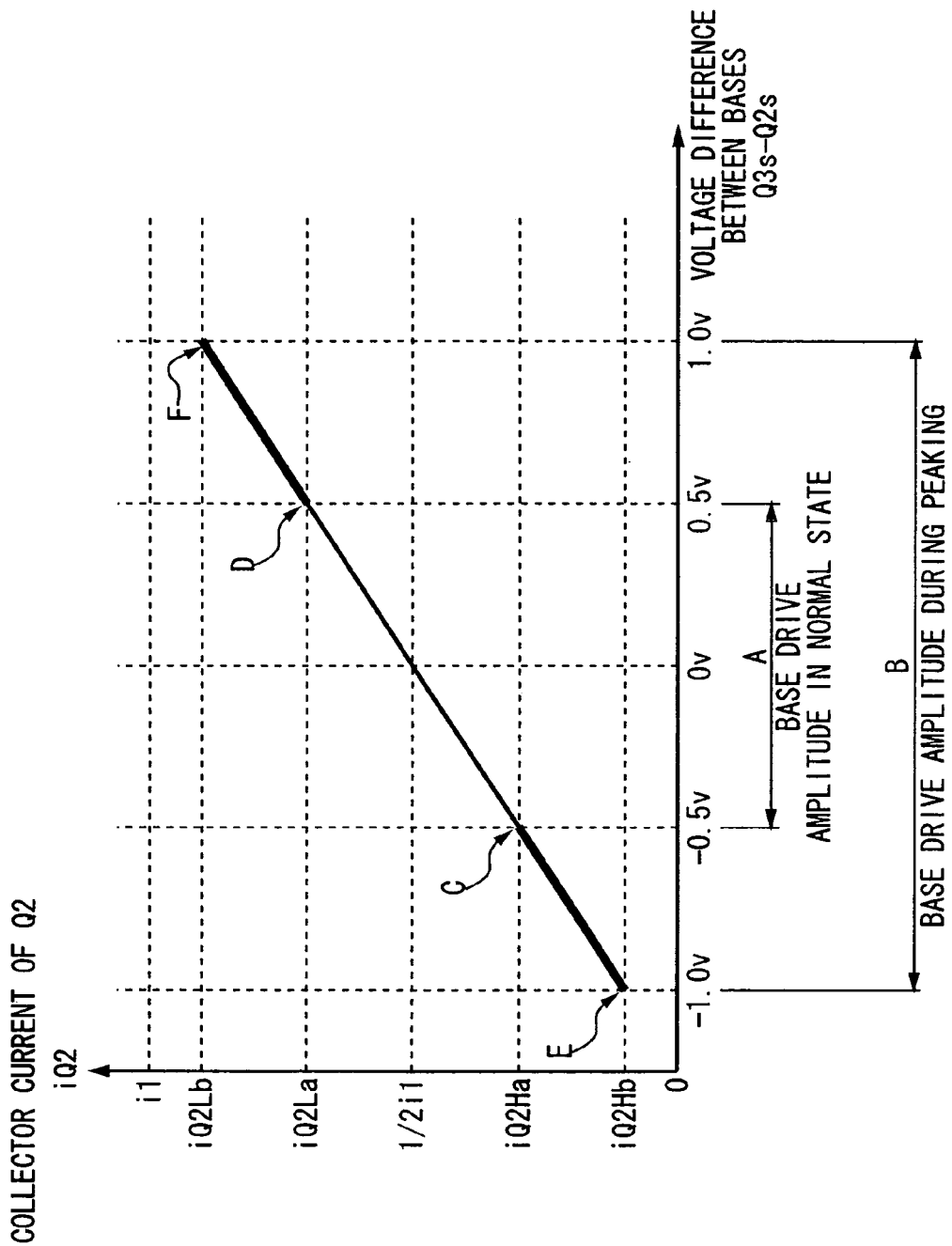
FIG. 6 shows the collector current characteristics against the voltage difference between the bases of a last stage in FIG. 3.

The collector voltage Q2s by the normal base drive amplitude, when it is in non-peaking on one side, becomes the output voltage with a high level based on the current amount at the point C in FIG. 6 and with a low level based on the current amount at the point D in FIG. 6.

The collector voltage Q2s by the base drive amplitude, when it is in peaking on the other side, becomes the output voltage with a high level twice the amplitude based on the current amount at the point E in FIG. 6 and with a low level twice the amplitude based on the current amount at the point F in FIG. 6. Since the output voltage twice the amplitude can be generated in that way, the wave form equivalently applied with the peaking operation can be outputted.

Returning to FIG. 3, the overshoot control unit 200 is provided with drive pulse generating means 230, a rise pulse superimposing section 210, and a fall pulse superimposing section 220.

Figure 4:
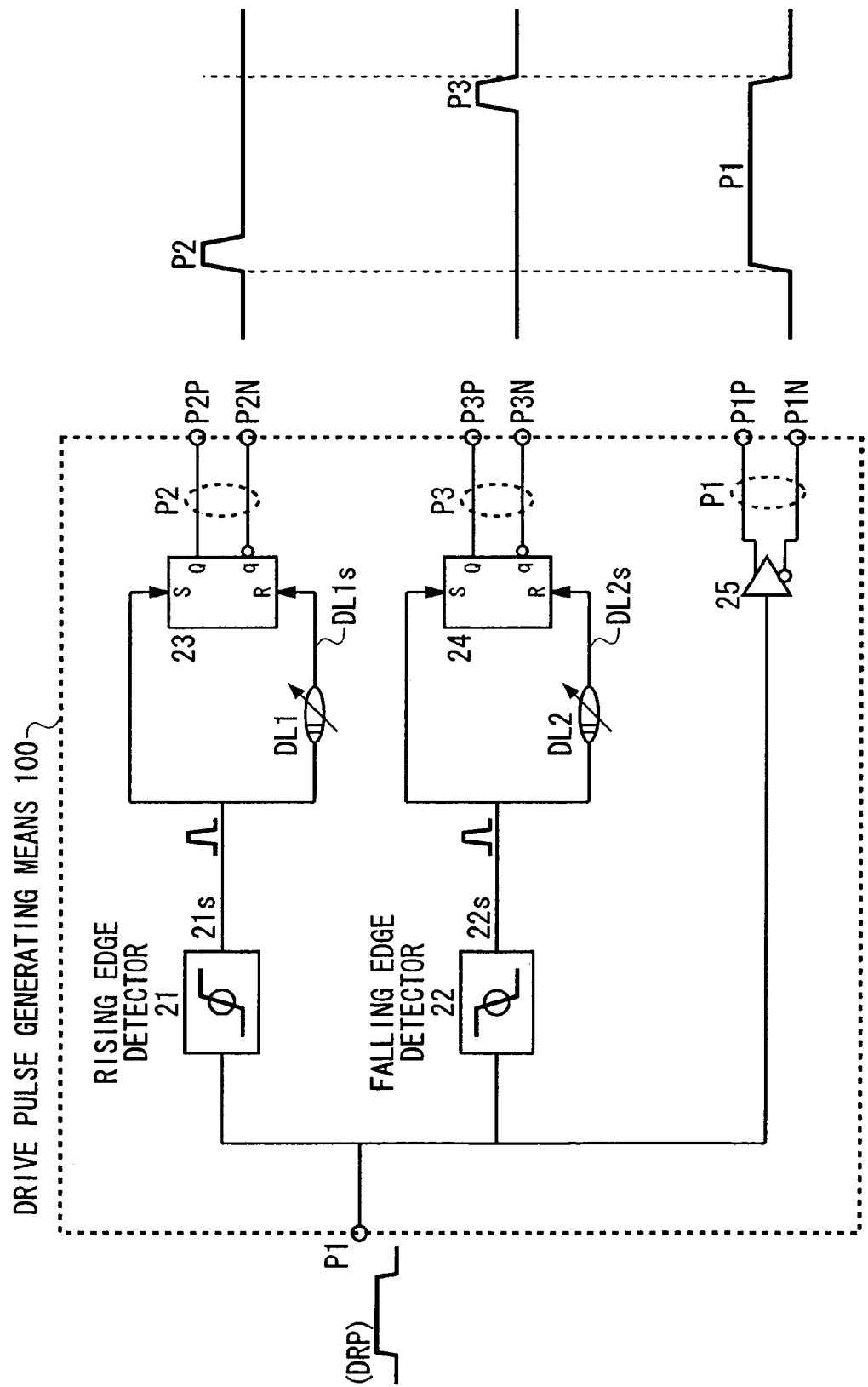
FIG. 4 shows an internal configuration example of drive pulse generating means.
Figure 5:
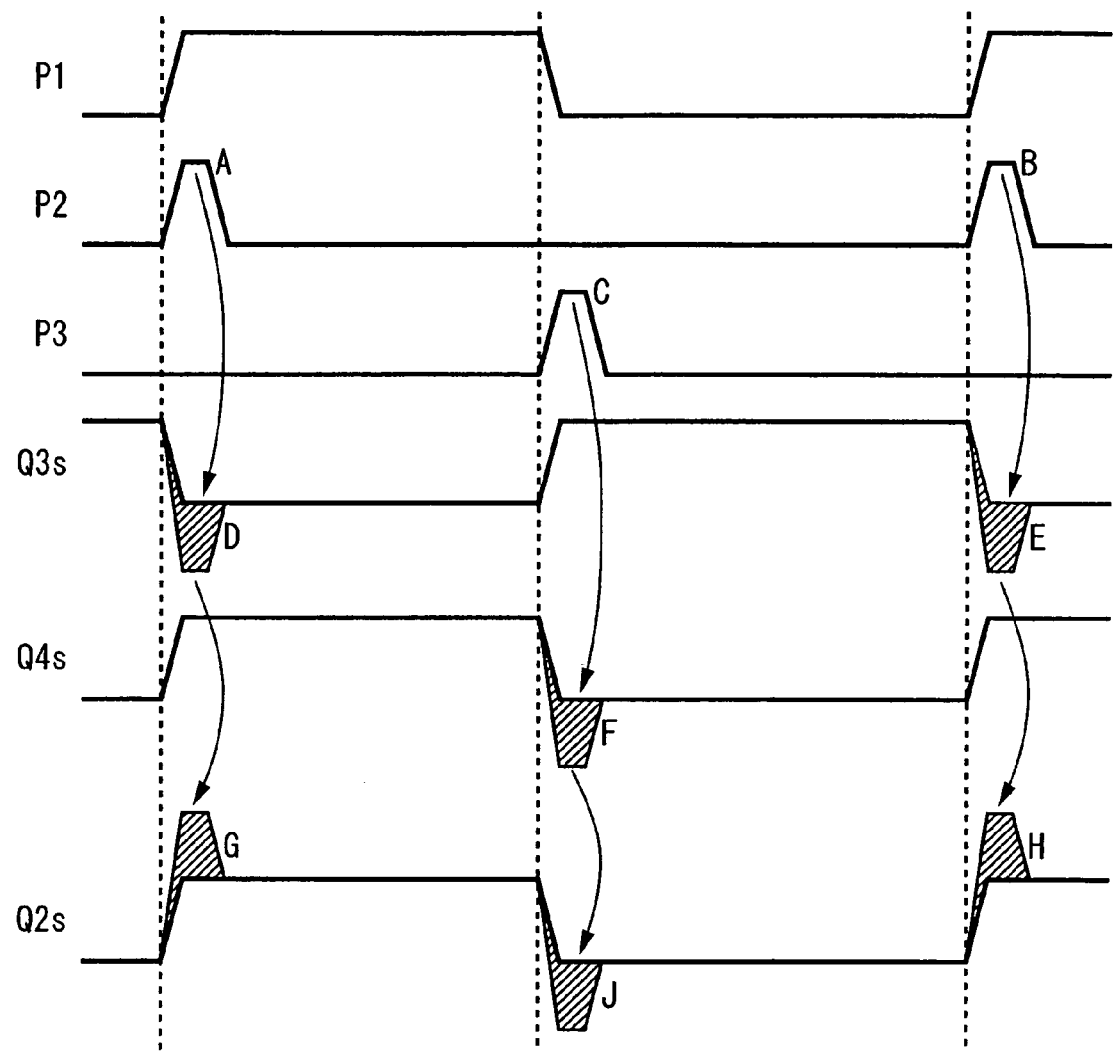
FIG. 5 shows a timing chart depicting peaking compensation in FIG. 3.

The drive pulse generating means 230 receives a format signal DRP from the waveform formatter FC and differentially outputs a driver input pulse P1 (P1P and P1N) which is the same as the format signal DRP, while generating and differentially outputting a predetermined rise correction pulse P2 (P2P and P2N) based on the transition of the rise of the format signal DRP, as well as generating and differentially outputting a predetermined fall correction pulse P3 (P3P and P3N) based on the transition of the fall FIG. 4 shows the internal configuration of the drive pulse generating means 230. The configuration elements include a rising edge detector 21, a falling edge detector 22, minute delay means DL1 and DL2, SR flip-flops 23 and 24, and a differential gate 25.

The rising edge detector 21 receives the format signal DRP as the driver input pulse P1, detects the edge of the rising side, and supplies a narrow pulse 21s of 50 pico seconds to the set input terminal S of the SR flip-flop 23 and the minute delay means DL1. The minute delay means DL1 which is a minute delay circuit whose delay amount is externally changeable receives the narrow pulse 21s and supplies a delay pulse delayed by 300 pico seconds as the delay amount to the reset input terminal R of the SR flip-flop 23. As the result, the differential rise correction pulse P2 (P2P and P2N) whose pulse period is about 300 pico seconds can be generated from the output terminals Q and q of the SR flip-flop 23.

In the same way, the falling edge detector 22 can generate the differential fall correction pulse P3 (P3P and P3N) whose pulse period is about 300 pico seconds based on the narrow pulse 22s at which the edge of the falling side of the drive input pulse P1 has been detected.

Further, if the drive input pulse P1 is a signal pulse, it is converted into a differential drive input pulse P1 (P1P and P1N) and outputted by the differential gate 25. Those differential output signals are supplied to the corresponding input terminals shown in FIG. 3 respectively. Further, it is desirable that each of the three output signals should have such phase relation that the peaking compensation can be properly performed.

Returning to FIG. 3, the rise pulse superimposing section 210 on one side, which is to give peaking compensation by superimposing on the pulse part of the rising side in the driver terminal output pulse Vout, is provided with the transistors Q5 and Q6 and the variable constant current source CS3. The collector of the transistor Q5 is coupled in parallel to the collector of the transistor Q3 of the preceding stage. As the result, when the rise correction pulse P2 (see A and B in FIG. 5) is received, a sink current iQ5 of the transistor Q5 occurs, and thereby the switch signal Q3s, which is the collector voltage of the transistor Q3 of the preceding stage, is superimposed and added with the voltage drop of (R1×iQ5) (see D and E in FIG. 5). As the result of supplying the switch signal Q3s superimposed in the above way to the base terminal of the transistor Q2 of the last stage, the collector voltage Q2s of the transistor Q2 becomes such high voltage (see G and H in FIG. 5) in the period of the rise correction pulse P2 as it raised by a predetermined amount can be outputted. Consequently, the peaking compensation of the rising side can be realized. By externally controlling the variable constant current source CS3, the current amount of the sink current iQ5 can be arbitrarily controlled, so the voltage drop amount to be superimposed and added can be adjusted, and consequently an advantage to independently adjust the peaking compensation amount of the rising side under a desired condition can be obtained.

The fall pulse superimposing section 220 on the other hand, which is to give peaking compensation by superimposing on the pulse part of the falling side in the driver terminal output pulse Vout, is provided with the transistors Q7 and Q8 and the variable constant current source CS4. The collector of the transistor Q7 is coupled in parallel to the collector of the transistor Q4 of the preceding stage. Consequently, when the fall correction pulse P3 (see C in FIG. 5) is received, a sink current iQ7 of the transistor Q7 occurs, and thereby the switch signal Q4s, which is the collector voltage of the transistor Q4 of the preceding stage, is superimposed and added with the voltage drop of (R2×iQ7) (see F in FIG. 5). As the result of supplying the switch signal Q4s to the base terminal of the transistor Q1 of the last stage, the collector voltage Q2s of the transistor Q2 becomes such low voltage (see J in FIG. 5) in the period of the all correction pulse P2 as it dropped by a predetermined amount can be outputted. Consequently, the peaking compensation of the falling side can be realized.

By externally controlling the variable constant current source CS4, the current amount of the sink current iQ7 can be arbitrarily controlled, so the voltage drop amount to be superimposed and added can be adjusted, and consequently an advantage of to independently adjust the peaking compensation amount of the falling side under a desired condition can be obtained.

According to the above configuration example, with the rise pulse superimposing section 210 capable of independently adjusting the peaking compensation amount of the rising side and the fall pulse superimposing section 220 capable of independently adjusting the peaking compensation amount of the falling side, which are realized by the semiconductor IC circuits, the peaking compensation is possible without any coil parts, so a considerable advantage to mount them in the form of an LSI can be obtained. Further, an advantage to independently adjust the peaking compensation processes of the rising and falling sides can also be obtained. Accordingly, an advantage that the DUT terminal-applied pulse Vdut to be supplied to the IC pin of the DUT becomes further the purposeful waveform can be obtained. In addition, as the quality of the applied waveform is improved, the timing precision of the waveform to be applied to the DUT is also improved, and consequently a considerable advantage to improve the measurement quality of the device test.

Further, although the present invention has been described by way of exemplary embodiments, it should be understood that those skilled in the art might make many changes and substitutions without departing from the spirit and the scope of the present invention, which is defined only by the appended claims.

Figure 7:
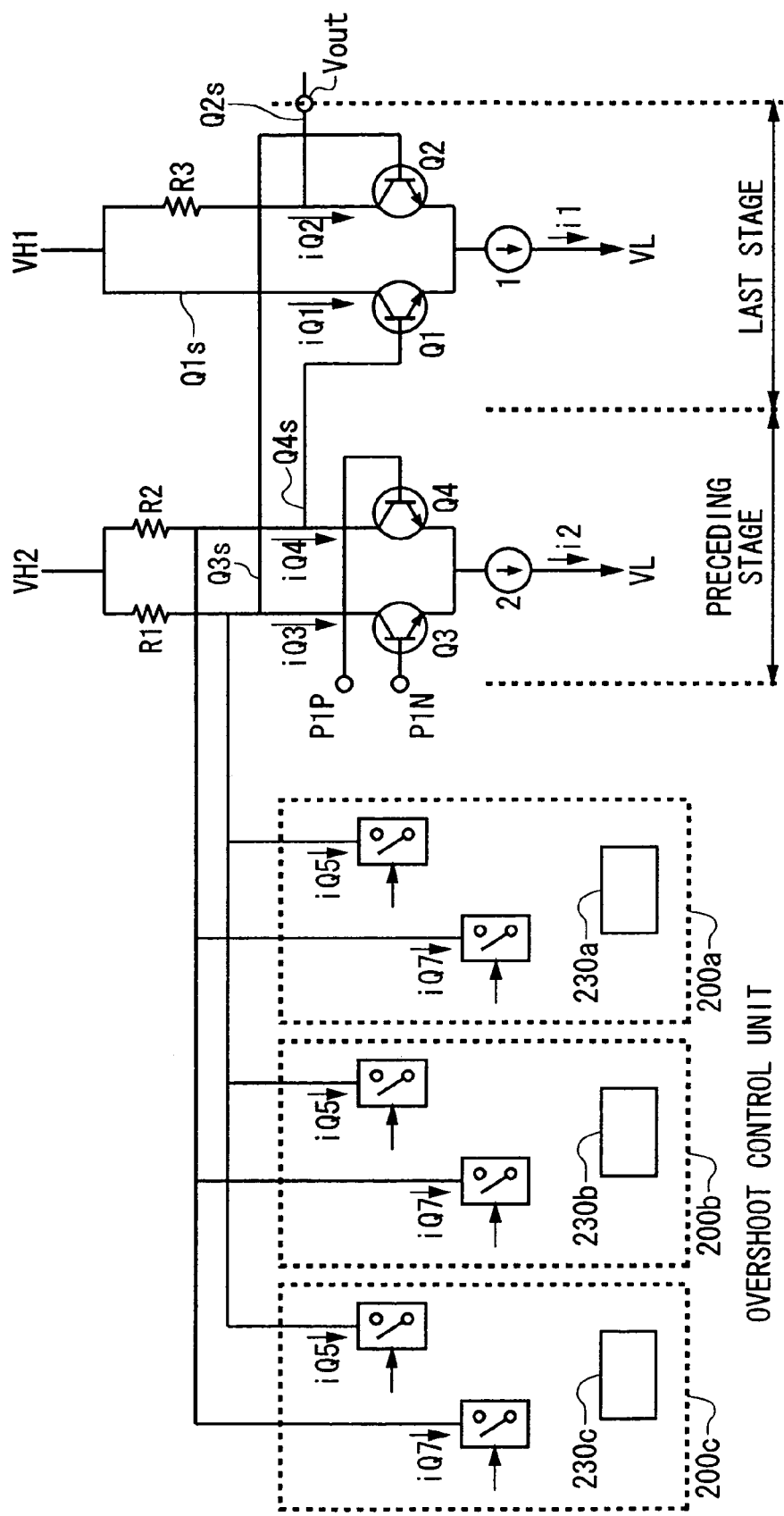
FIG. 7 shows an example of the driver circuit provided with three systems of overshoot controllers.

For example, although the above embodiment is provided with one system of the overshoot control unit 200, it may be provided with three systems of overshoot control units 200a, 200b and 200c as shown in FIG. 7. Each sink current of the three systems is given a predetermined weight. And minute delay means DL1 and DL2 provided to each drive pulse generating means 230a, 230b and 230c change their delay amount in a desired manner.

Figure 8:
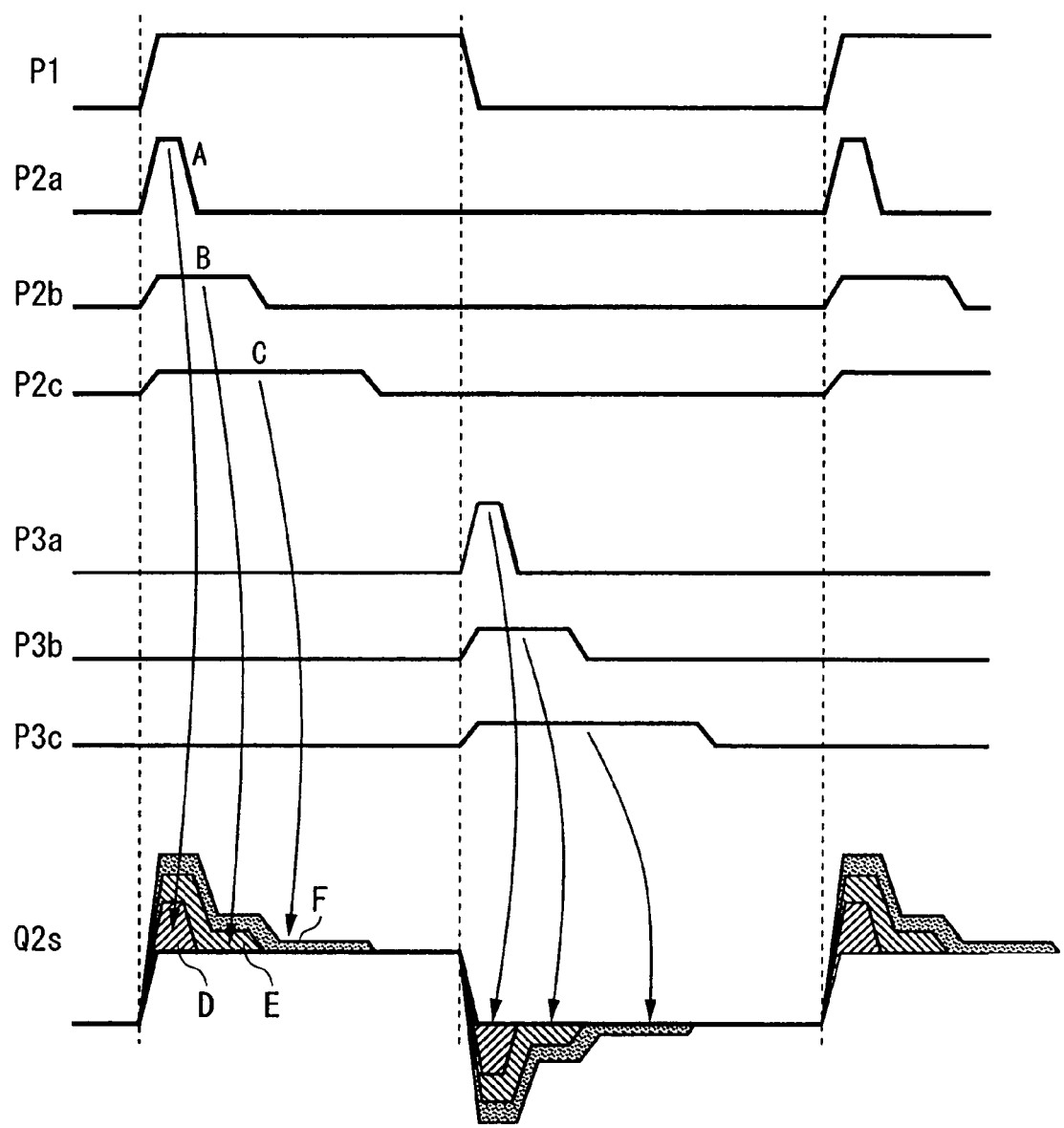
FIG. 8 shows a timing chart depicting peaking compensation in FIG. 7.
Figure 9:
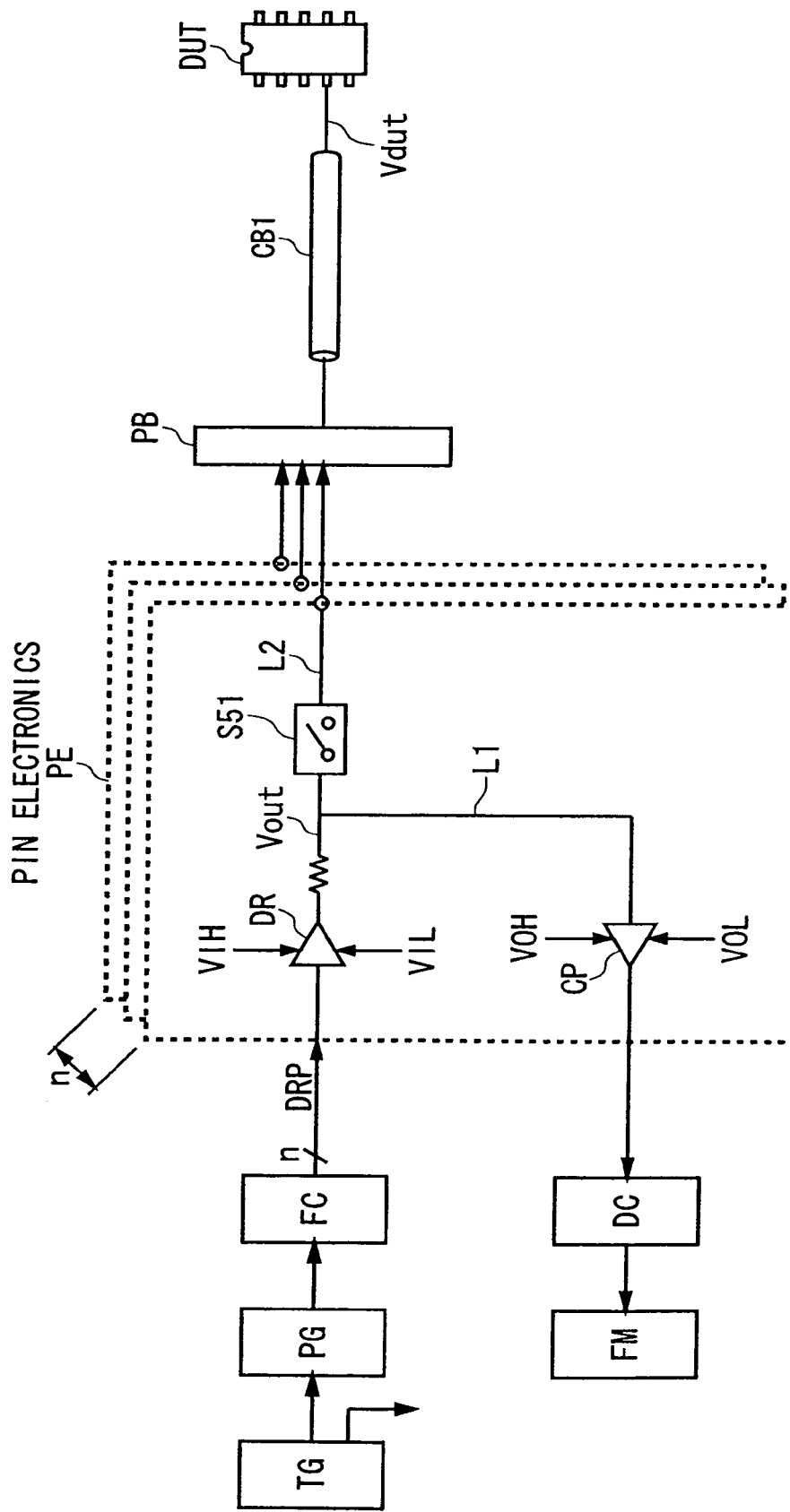
FIG. 9 shows the schematic configuration of a semiconductor test apparatus.

Accordingly, the rise correction pulses P2a, P2b and P2c (see A, B and C in FIG. 8) is generated, and in the same way the fall correction pulses P3a, P3b and P3c is generated as shown by the timing chart in FIG. 8. Consequently, the waveform (see D, E and F in FIG. 8) of the driver terminal output pulse Vout weighted and superimposed with three sink currents can be generated. In this case, since peaking compensation into a predetermined waveform can be performed, a considerable advantage that the DUT terminal-applied pulse Vdut can be applied in the waveform closer to an ideal can be achieved.

Moreover, although the minute delay means DL1 and DL2 shown in FIG. 4 has the fixed delay amounts in the above embodiment, they may be variable delay means which is externally changeable. In this case, an advantage to externally adjust the period of the compensation pulse into a desired condition can be obtained.

INDUSTRIAL APPLICABILITY

This invention performs the effects present below from the above description.

As obvious from the description above, according to the present invention, as the peaking circuit is configured with semiconductor circuits, an advantage to perform peaking compensation without any coil parts can be obtained. Therefore, an advantage that a plurality of driver circuits of hundreds of channels can be mounted in the form of an LSI is obtained.

Further, by the configuration provided with the means capable of independently adjusting the peaking compensation processes of the rising and falling sides, the waveforms of the rising and falling sides with regard to the IC pin of the DUT can be arbitrarily and independently adjusted, and consequently an advantage that the waveform to be applied whose quality is excellent can be supplied to the IC pin of the DUT is obtained. In addition, as the quality of the waveform to be applied to the DUT is improved, a considerable advantage to further improve the quality of the device test can be obtained.

Therefore, the technical effects as well as the economical effects on industries of this invention are significant.

The invention claimed is:

1. A semiconductor tester, comprising:
a driver circuit for supplying a signal of a predetermined waveform to be applied to an IC pin of a device under test (DUT) via a predetermined transmission line, wherein said driver circuit comprises:
means for receiving a driver input pulse of a logic signal, detecting a rising edge of said driver input pulse and generating a differential rise correction pulse to perform a peaking correction on a rise of a waveform;
means for receiving a driver input pulse of a logic signal, detecting a falling edge of said driver input pulse and generating a differential fall correction pulse to perform a peaking correction on a fall of a waveform; and
means for performing said peaking correction on a rising part of a waveform outputted from said driver circuit based on said differential rise correction pulse, while performing a peaking correction on a falling part of a waveform outputted from said driver circuit based on said differential fall correction pulse.

2. A semiconductor tester comprising:
a driver circuit for supplying a signal of a predetermined waveform to be applied to an IC pin of a device under test (DUT) via a predetermined transmission line,
wherein said driver circuit comprises:
drive pulse generating means for receiving a rising edge of a driver input pulse of a logic signal and generating a differential rise correction pulse, while receiving a falling edge of a driver input pulse of a logic signal and generating a differential fall correction pulse;
a rise pulse superimposing section for receiving said differential rise correction pulse and generating a first sink current whose current amount corresponds to said differential rose correction pulse;
a fall pulse superimposing section for receiving said fall correction pulse and generating a second sink current whose current amount corresponds to said fall correction pulse; and
preceding and last stages of said driver circuit for outputting a test waveform to be supplied to said DUT by receiving said first sink current and performing a peaking correction on a rising side of said test waveform, while receiving said second sink current and performing a peaking correction on a falling side of said test waveform.

3. A semiconductor tester comprising:
a driver circuit for supplying a signal of a predetermined waveform to be applied to an IC pin of a device under test (DUT) via a predetermined transmission line,
wherein said driver circuit comprises:
a plurality (n) of drive pulse generating means, each of which receives a rising edge of a driver input pulse of a logic signal and generates a differential rise correction pulse so that said rise correction pulse has a different pulse period, while receiving a falling edge of a driver input pulse of a logic signal and generating a differential fall correction pulse so that said fall correction pulse has a different pulse period;
a plurality (n) of rise pulse superimposing sections, each of which receives a plurality (n) of said differential rise correction pulses and generates a first sink current of a predetermined sink current amount for a predetermined pulse period;
a plurality (n) of fall pulse superimposing sections, each of which receives a plurality (n) of said fall correction pulses and generates a second sink current of a predetermined sink current amount for a predetermined pulse period; and
preceding and last stages of said driver circuit for outputting a test waveform to be supplied to said DUT by receiving a plurality (n) of said first sink currents and performing a peaking correction on a rising side of said test waveform, while receiving a plurality (n) of said second sink currents and performing a peaking correction on a falling side of said test waveform.

4. A semiconductor tester as claimed in claim 2, wherein said drive pulse generating means receives a drive input pulse of a logic signal,
firstly detects a rising edge of said driver input pulse and generates a differential rise correction pulse of a predetermined period, secondly detects a falling edge of said driver input pulse and generates a differential fall correction pulse of a predetermined period, and thirdly generates a differential driver pulse corresponding to said driver input pulse.

5. A semiconductor tester as claimed in claim 2, wherein said rise pulse superimposing section comprises a first constant current source and first and second transistors of a first differential amplification configuration, said first constant current source is coupled to emitters of both of said transistors and makes a constant current amount flowing through any of both of said transistors be constant, and said first and second transistors receive said differential rise correction pulse in base terminals thereof and generate a first sink current of a constant current amount on which current switching has been performed.

6. A semiconductor tester as claimed in claim 2, wherein said fall pulse superimposing section comprises a second constant current source and third and fourth transistors of a second differential amplification configuration, said second constant current source is coupled to emitters of both of said transistors and makes a constant current amount flowing through any of both of said transistors be constant, and said third and fourth transistors receive said differential fall correction pulse in base terminals thereof and generate a second sink current of a constant current amount on which current switching has been performed.

7. A semiconductor tester as claimed in claim 2, wherein said preceding stage of said driver circuit, which supplies a differential drive voltage signal to determine a voltage level, which is a high or low level, to be outputted from said last stage, comprises first and second resistors, a third constant current source, and fifth and sixth transistors of a third differential amplification configuration, said first resistor, which is a load resistor coupled to a collector of said fifth transistor, is coupled to a collector terminal of said first transistor for generating said first sink current of said rise pulse superimposing section, said second resistor, which is a load resistor coupled to a collector of said sixth transistor, is coupled to a collector terminal of said third transistor for generating said second sink current of said fall pulse superimposing section, said third constant current source is coupled to both emitters of said third differential transistors and allows a predetermined constant current amount to flow, and current switching is performed based on a differential drive pulse received by both of said transistors of said third differential amplification configuration, while said differential drive voltage signal weighted by said first and second sink currents is outputted from collectors of both of said transistors and supplied to said last stage.

8. A semiconductor tester as claimed in claim 2, wherein said last stage of said driver circuit comprises seventh and eighth transistors of a fourth differential amplification configuration, first and second current dividing resistors, a first load resistor, and a fourth constant current source, said seventh and eighth transistors receive said differential drive voltage signal outputted from said preceding stage of said driver circuit in a base input terminal thereof, amplify said differential drive voltage signal in a predetermined manner, and generate an applied signal of a predetermined waveform to be supplied to said DUT from a collector terminal of said eighth transistor, said first and second current dividing resistors, which are emitter resistors individually coupled to emitters of both of said transistors, while other ends of said current dividing resistors are coupled to said fourth constant current source, said first load resistor, which becomes a load resistor coupled to said constant current source and said collector terminal of said eighth transistor, supplies said applied signal of a predetermined waveform to said DUT, and said fourth constant current source becomes a constant current source inserted between a negative power source and said first and second current dividing resistors.

9. A semiconductor tester as claimed in claim 5, wherein said first or second constant current source is a fixed constant current source for supplying an invariable constant current amount or a variable constant current source whose constant current amount is externally changeable.

10. A semiconductor tester as claimed in claim 3, wherein said drive pulse generating means receives a drive input pulse of a logic signal, firstly detects a rising edge of said driver input pulse and generates a differential rise correction pulse of a predetermined period, secondly detects a falling edge of said driver input pulse and generates a differential fall correction pulse of a predetermined period, and thirdly generates a differential driver pulse corresponding to said driver input pulse.

11. A semiconductor tester as claimed in claim 3, wherein said rise pulse superimposing section comprises a first constant current source and first and second transistors of a first differential amplification configuration, said first constant current source is coupled to emitters of said both of said transistors and makes a constant current amount flowing through any of said both of said transistors be constant, and said first and second transistors receive said differential rise correction pulse in base terminals thereof and generate a first sink current of a constant current amount on which current switching has been performed.

12. A semiconductor tester as claimed in claim 3, wherein said fall pulse superimposing section comprises a second constant current source and third and fourth transistors of a second differential amplification configuration, said second constant current source is coupled to emitters of said both of said transistors and makes a constant current amount flowing through any of said both of said transistors be constant, and said third and fourth transistors receive said differential rise correction pulse in base terminals thereof and generate a second sink current of a constant current amount on which current switching has been performed.

13. A semiconductor tester as claimed in claim 3, wherein said preceding stage of said driver circuit, which supplies a differential drive voltage signal to determine a voltage level, which is a high or low level, to be outputted from said last stage, comprises first and second resistors, a third constant current source, and fifth and sixth transistors of a third differential amplification configuration, said first resistor, which is a load resistor coupled to a collector of said fifth transistor, is coupled to a collector terminal of said a first transistor for generating said first sink current of said rise pulse superimposing section, said second resistor, which is a load resistor coupled to a collector of said sixth transistor, is coupled to a collector terminal of said a third transistor for generating said second sink current of said fall pulse superimposing section, said third constant current source is coupled to both emitters of said third differential transistors and allows a predetermined constant current amount to flow, and current switching is preformed based on a differential drive pulse received by said both of said transistors of said third differential amplification configuration, while said differential drive voltage signal weighted by said first and second sink currents is outputted from collectors of said both of said transistors and supplied to said last stage.

14. A semiconductor tester as claimed in claim 3, wherein said last stage of said driver circuit comprises seventh and eighth transistors of a fourth differential amplification configuration, first and second current dividing resistors, a first load resistor, and a fourth constant current source, said seventh and eighth transistors receive said differential drive voltage signal outputted from said preceding stage of said driver circuit in a base input terminal thereof, amplify said differential drive voltage signal in a predetermined manner, and generate an applied signal of a predetermined waveform to be supplied to said DUT from a collector terminal of said eighth transistor, said first and second current dividing resistors, which are emitter resistors individually coupled to emitters of said both of said transistors, while other ends of said current dividing resistors are coupled to said fourth constant current source, said first load resistor, which becomes a load resistor coupled to said constant current source and said collector terminal of said eighth transistor, supplies said applied signal of a predetermined waveform to said DUT, and said fourth constant current source becomes a constant current source inserted between a negative power source and said first and second current dividing resistors.

15. A semiconductor tester as claimed in claim 6, wherein said first or second constant current source is a fixed constant current source for supplying an invariable constant current amount or a variable constant current source whose constant current amount is externally changeable.

* * * * *